United States Patent
Gogl et al.

(10) Patent No.: US 6,577,528 B2
(45) Date of Patent: Jun. 10, 2003

(54) CIRCUIT CONFIGURATION FOR CONTROLLING WRITE AND READ OPERATIONS IN A MAGNETORESISTIVE MEMORY CONFIGURATION

(75) Inventors: Dietmar Gogl, Essex Junction, VT (US); Helmut Kandolf, München (DE); Heinz Hönigschmid, Essex Junction, VT (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/023,155

(22) Filed: Dec. 17, 2001

(65) Prior Publication Data

US 2002/0080661 A1 Jun. 27, 2002

(30) Foreign Application Priority Data

Dec. 15, 2000 (DE) .......................... 100 62 570

(51) Int. Cl.$^7$ .......................... G11C 11/00; G11C 11/14
(52) U.S. Cl. .................. 365/158; 365/171; 365/173
(58) Field of Search ................. 365/158, 171, 365/173, 189.01, 230.01

(56) References Cited

U.S. PATENT DOCUMENTS 6,272,041 B1 * 8/2001 Naji ........................... 365/158
6,331,943 B1 * 12/2001 Naji et al. ................... 365/158

FOREIGN PATENT DOCUMENTS

DE          WO 00/38192           6/2000

\* cited by examiner

Primary Examiner—Son Mai
(74) Attorney, Agent, or Firm—Laurence A. Greenberg; Werner H. Stemer; Gregory L. Mayback

(57) ABSTRACT

A circuit configuration for controlling write operations and read operations in an MRAM memory configuration includes selection transistors grouped in sections of equal numbers of the selection transistors. The selection transistors of each of the sections are jointly connected, at the ends of the bit lines, to a respective interacting pair of read/write amplifiers via those electrode terminals of the selection transistors that are not connected to the bit lines. The read/write amplifiers are controlled such that if a write signal is fed thereto, write currents for writing a logic "1" or "0" flow in a first direction or a second direction in all of the bit lines selected by a corresponding column select signal and, if a read signal is fed in, a logic state stored in one of the magnetoresistive memory cells can be read out.

11 Claims, 3 Drawing Sheets

CIRCUIT CONFIGURATION FOR CONTROLLING WRITE AND READ OPERATIONS IN A MAGNETORESISTIVE MEMORY CONFIGURATION

BACKGROUND OF THE INVENTION

Field of the Invention

The invention relates to a circuit configuration for controlling write operations and read operations in a magnetoresistive memory configuration.

In magnetoresistive memories (MRAMs), the memory effect is a result of the magnetically variable electrical resistance of the memory cell. Such a memory cell is disposed at the crossover between a bit line and a word line, which are provided orthogonally with respect to one another. At the crossover point between these conductors there is a specific multilayer system formed of a stack of a soft-magnetic material and a hard-magnetic material one above the other, between which there is a tunnel oxide. The value of the resistance contained in the memory cell between the conductors WL and BL depends on whether the magnetization direction in the materials is parallel (low cell resistance) or antiparallel (high cell resistance). The cell is written to by switching the soft-magnetic film through an electromagnetic field. The switching process requires a superposition of the two magnetic fields of a word line and a bit line. In order that the soft-magnetic layer can be polarized in two opposite directions, it is necessary that at least one of the programming currents can flow in both directions through the corresponding lines.

Thus, in order to generate the writing magnetic field, an impressed current is required on the corresponding lines (word line and bit line), wherein the current flows in both directions on the bit line irrespective of whether it is desired to write a logic "1" or "0". For performing a read operation, a specific voltage is applied to the cell to be read and the current flowing through the cell is measured.

SUMMARY OF THE INVENTION

It is accordingly an object of the invention to provide a circuit configuration which is suitable for controlling write and read operations in an MRAM memory configuration of this type, i.e. a selection circuit on the bit lines, which can fulfil the above-described functions for writing and reading a logic 1 or a logic 0 to and from the respective memory cells. A further object is to provide an MRAM memory configuration which is equipped with a selection circuit of this type.

With the foregoing and other objects in view there is provided, in accordance with the invention, in an MRAM memory configuration having a plurality of magnetoresistive memory cells with associated bit lines and word lines respectively running in a row direction and a column direction and crossing one another at respective ones of the magnetoresistive memory cells, a circuit configuration for controlling write operations and read operations, including:

column select lines for providing column select signals;

selection transistors connected to the bit lines, the selection transistors having respective control electrodes connected to the column select lines and being controllable via the column select signals;

given ones of the selection transistors being first selection transistors, each of the bit lines having ends and having a respective one of the first selection transistors provided at the ends of each of the bit lines on both sides of each of the magnetoresistive memory cells;

read/write amplifiers having respective current sources and current sinks;

output lines connected to the read/write amplifiers;

the first selection transistors being grouped in sections including equal numbers of the first selection transistors, the first selection transistors of each of the sections being jointly connected, at the ends of the bit lines, to a respective interacting pair of the read/write amplifiers via those electrode terminals of the first selection transistors that are not connected to the bit lines; and the read/write amplifiers being controlled such that if a write signal is fed thereto, write currents for writing one of a logic "1" and a logic "0" flow selectively in a first direction and in a second direction opposite thereto in all of the bit lines selected by a corresponding column select signal on a respective one of the column select lines and, if a read signal is fed in, a logic state stored in a selected one of the magnetoresistive memory cells can be read out via a given one of the output lines.

In other words, a circuit configuration for controlling write and read operations in an MRAM memory configuration, which has a plurality of magnetoresistive memory cells with associated bit lines and word lines which run in the row and column directions and cross one another at the respective memory cell, wherein selection transistors are connected to all of the bit lines, the control electrodes of which transistors can be driven by column select signals fed via column select lines, wherein each bit line in each case has a first selection transistor at its ends on both sides of each memory cell, the first selection transistors, which are combined in sections in the same number in each case, at each end of the bit lines, are jointly connected to a respective interacting read/write amplifier pair by their electrode terminals that are not connected to the bit line, each read/write amplifier of which pairs has a current source and a current sink and is connected in such a way that, through a write signal that drives them, in all bit lines selected by a corresponding column select signal on the respective column select line write currents for writing a logic "1" or a logic "0" selectively flow in a first direction or in a second direction opposite thereto and, in the event of a read signal being fed in, a logic state stored in the selected memory cell can be read out via an output line.

In accordance with one essential aspect of the invention there is a circuit configuration for controlling write and read operations in an MRAM memory configuration, which has a plurality of magnetoresistive memory cells with associated bit and word lines which run in the row and column directions and cross one another at the respective memory cell, selection transistors being connected to all of the bit lines, the control electrodes of which transistors can be driven by column select signals fed via column select lines. Each bit line in each case has a first selection transistor at its two ends. The first selection transistors, which are combined in sections in the same number in each case, at each end of the bit lines, are jointly connected to a respective interacting read/write amplifier pair by their electrode terminals that are not connected to the bit line, each read/write amplifier of which pairs has a current source and a current sink and is connected in such a way that, through a write signal that drives them, in all bit lines selected by a corresponding column select signal on the respective column select line write currents for writing a logic "1" , or a logic "0" optionally flow in a first direction or in a second direction opposite thereto and, in the event of a read signal being fed in, a logic state stored in the selected memory cell can be read out via an output line of the read/write amplifiers.

In order that the non-selected bit lines are kept at a specific potential, second selection transistors are connected to the two ends of the bit lines, the control electrodes of which transistors are driven by the complement of the respective column select signal and a constant voltage is jointly applied to those electrode terminals of the transistors which are not connected to the bit lines.

In principle, there are two different possible forms of organization of the bit lines of an MRAM memory array:

1) the bit block configuration and 2) the word block configuration, which is similar to the word block configuration that is selected in the case of DRAMs.

If the bit lines are formed as bit blocks, the first selection transistors at the two ends of in each case n successive bit lines of the bits of the memory configuration that are assigned in each case to one of a plurality of bit blocks are in each case jointly connected to the interacting read/write amplifier pair and a respective column select line selects, through the associated first selection transistor, one of the n bit lines of each bit block, the constant voltage being jointly applied to the second selection transistors of the bit blocks likewise block by block at the two ends of the bit lines.

One bit block may include for example n=4 bit lines.

The constant voltage is preferably fed to the second selection transistors from both sides of the bit lines.

If the bit lines or the memory cell array are subdivided into block sections word block by word block, the bits of a word of the MRAM memory configuration are physically provided next to one another, in which case a respective column select line, through the use of the column select signal fed in, in each case selects one word block from m word blocks, the word block including n bits and corresponding n bit lines, and connects these n bit lines to associated n multiplexed bit lines, the first selection transistors in each case one of the n bit lines of all m word blocks and a respective read/write amplifier pair being connected to the multiplexed bit lines.

In the word block configuration, the constant voltage is preferably also applied to the second selection transistors word block by word block. This constant voltage is preferably fed to the bit lines from both sides.

According to another feature of the invention, given ones of the selection transistors are second selection transistors respectively connected to the two ends of each of the bit lines; and the control electrodes of the second selection transistors are driven by a complement of the corresponding column select signal and a constant voltage is jointly applied to those electrode terminals of the second selection transistors that are not connected to the bit lines such that the bit lines which are not selected by a column select signal are kept at a given potential.

According to another feature of the invention, the MRAM memory configuration is organized in bit blocks such that the first selection transistors of in each case n successive ones of the bit lines associated with bits of the MRAM memory configuration that are assigned in each case to one of the bit blocks are, at the two ends of the successive ones of the bit lines, in each case jointly connected to an interacting pair of the read/write amplifiers, with n being an integer number; a respective one of the column select lines selects one of the n successive ones of the bit lines from each of the bit blocks; and given ones of the selection transistors are second selection transistors respectively connected to the two ends of each of the bit lines, and given ones of the second selection transistors associated with the one of the bit blocks are in each case jointly supplied with a constant voltage at the two ends of the bit lines.

According to yet another feature of the invention, the MRAM memory configuration is organized in word blocks such that all bits of a word of the MRAM memory configuration are physically provided next to one another, a respective one of the column select lines selects, with a column select signal, one of the word blocks from m of the word blocks, the one of the word blocks is formed of n bits and corresponding n bit lines, and the respective one of the column select lines switches the n bit lines to associated n multiplexed bit lines, with n and m being integer numbers; and the first selection transistors on both sides of in each case one of the n bit lines of all m word blocks and a respective interacting pair of the read/write amplifiers are connected to the n multiplexed bit lines.

According to a further feature of the invention, the MRAM memory configuration is configured such that a quotient m:4 is a power of 2, with m being an integer number.

A magnetoresistive memory configuration according to the invention is distinguished by the fact that it has such a circuit configuration described above for controlling the write and read operations.

The description below describes, with reference to the accompanying drawing, two basic embodiments—which differ with regard to their form of organization—of the circuit configuration according to the invention, in each case with a magnetoresistive memory configuration equipped with the circuit configuration according to the invention.

Other features which are considered as characteristic for the invention are set forth in the appended claims.

Although the invention is illustrated and described herein as embodied in a circuit configuration for controlling write and read operations in a magnetoresistive memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
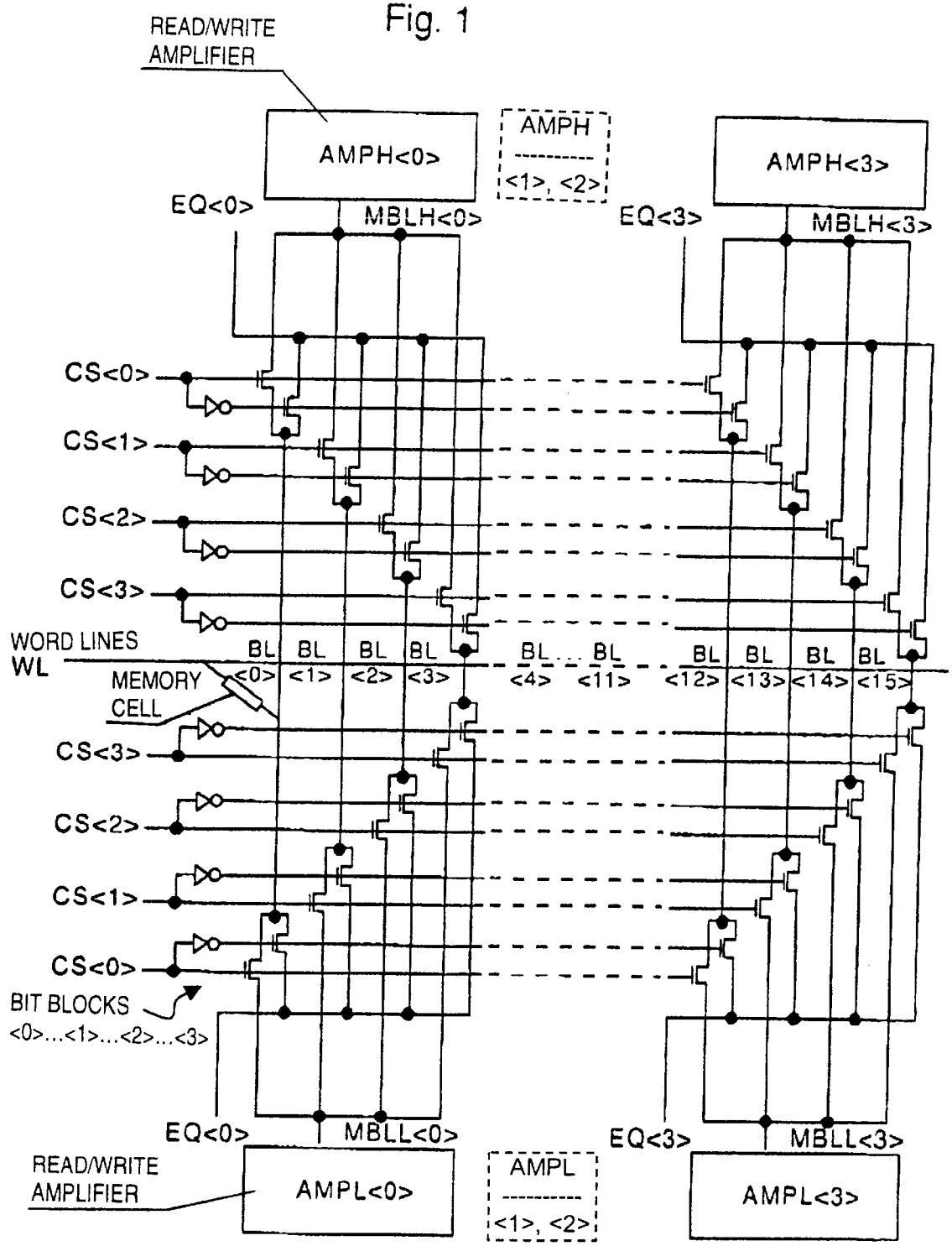
FIG. 1 is a schematic circuit diagram of a first preferred embodiment of a circuit configuration according to the invention for controlling write and read operations in an MRAM memory configuration in a bit block organization.

Referring now to the figures of the drawings in detail and first, particularly, to FIG. 1 thereof, there is shown a circuit configuration according to the invention for controlling write and read operations in an MRAM memory configuration, in this bit block organization, if a word includes the bits 0 to m (e.g. 0 to 15) all bits having the same ordinal number are combined in a bit block (e.g. all bits <0> in the bit block 0), and a chip select signal fed via a chip select line, e.g. CS<0>, selects a bit line from each block. For example, CS<0>selects bit line BL<0>, BL<4>, BL<8> and BL<12>. Each selected bit line is connected to a respective amplifier pair, e.g. AMPL<0>, AMPH<0>. The first selection transistors, connected to a respective column select line CS on the control side, are provided at both ends of each bit line and are in each case interconnected by their first ends to MBLL and MBLH and interacting read/write amplifier pairs AMPL and AMPH are respectively connected to these circuit nodes MBLL, MBLH.

The advantage of the bit block organization is that each amplifier pair AMPL, AMPH is situated directly at its bit lines and, consequently, all signal paths are approximately of the same length. However, a disadvantage is that the column select lines CS<0>, . . . , CS<3> run parallel to the word lines WL, which are only indicated, over the entire array width of the memory configuration, for which reason this circuit configuration occupies a larger chip area.

Figure 2:
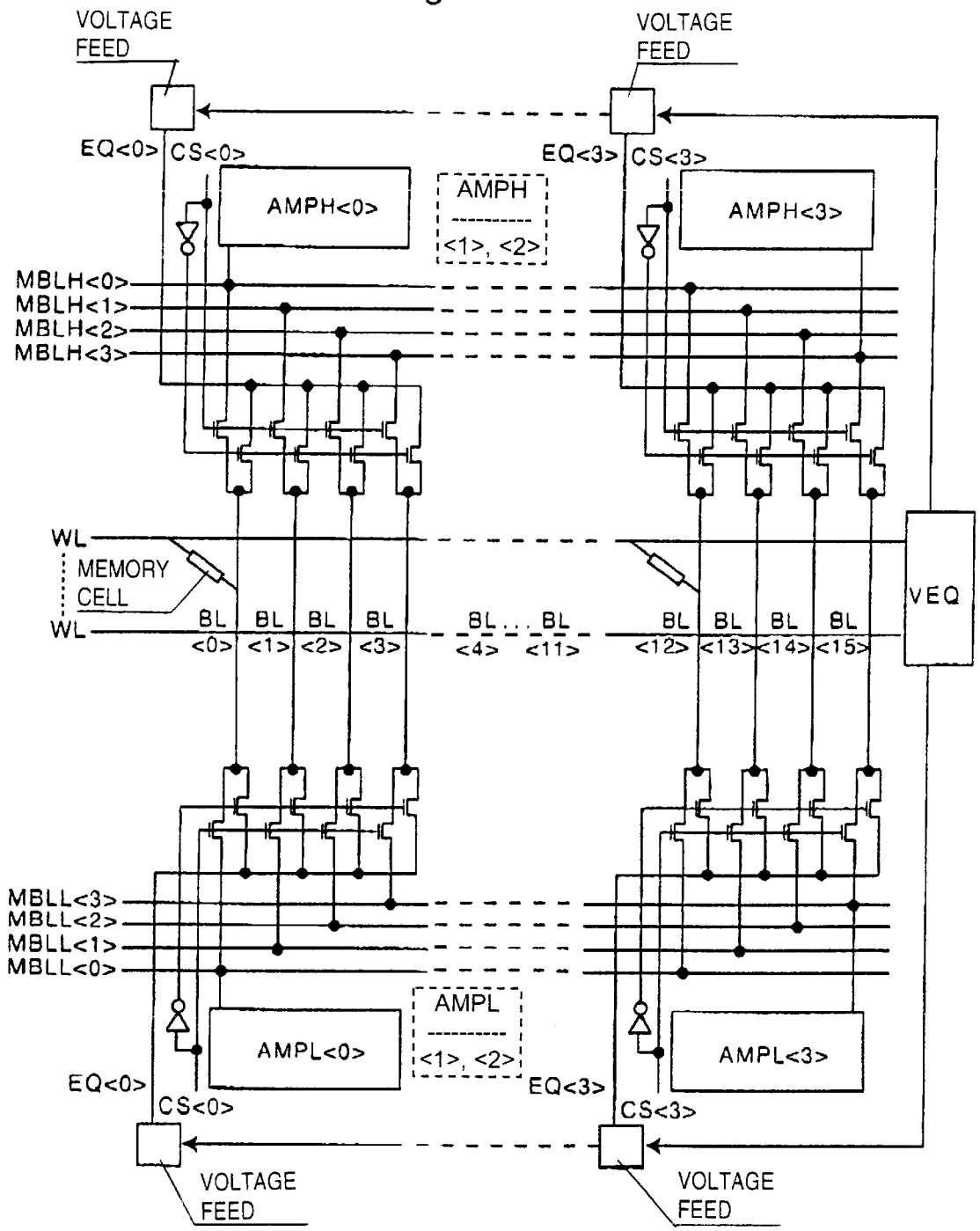
FIG. 2 is a schematic circuit diagram of a second embodiment of a circuit configuration according to the invention in a word block organization.

FIG. 2 shows a circuit configuration according to the invention for controlling write and read operations in an MRAM memory configuration in a word block organization. In this case, the bits of a word are physically provided next to one another. Thus, with the chip select signal fed via a chip select line (e.g. CS<0>), a word block, e.g. Block<0> including the bit lines BL<0>:<3> is selected and switched onto associated multiplexed bit lines MBLH and MBLL<0>:<3> through the use of respective first selection transistors. With CS<1>, Block<1> formed of the bit lines BL<4>:<7> is selected and likewise switched onto the multiplexed bit lines MBLL and MBLH<0>:<3>, etc. Attached to each multiplexed bit line MBLL and MBLH<0>:<3> is a respective read/write amplifier pair AMPL, AMPH, which supplies the selected bit line (e.g. BL<0>on MBL<0>, BL<1> on MBL<1>, etc.) with the required voltages and currents for reading and writing.

The advantage of the circuit configuration in a word block organization as illustrated in FIG. 2 is that the column select lines do not have to run over the entire array width of the MRAM memory configuration, but rather can be routed only over a short section and thereby parallel to the bit lines. The disadvantage is the long signal path lengths compared with the circuit configuration shown in FIG. 1. Firstly, very long signal paths may be produced e.g. if BL<3> is connected to AMPL, AMPH<3> via CS<0>. Secondly, the signal paths are of different lengths, which can lead to problems in the synchronization of the signals. Since the multiplexed bit lines MBLH and MBLL are routed over the entire array width of the memory configuration, the space requirement therefor is large.

The two forms of organization described above with reference to FIGS. 1 and 2, i.e. the bit block organization and word block organization, take account of the fact that non-selected bit lines must be kept at a specific potential. Therefore, the circuit configurations shown in FIG. 1 and FIG. 2 have second selection transistors, i.e. in each case a second selection transistor on each bit line, which are in each case driven by the inverted select signal. As a result, each non-selected bit line is automatically connected to a line EQ. By way of example, if CS<0> is high in FIG. 1, the bit lines BL<0>, BL<4>, BL<8> and BL<12> are selected and connected to the associated amplifiers AMPL and AMPH via the first selection transistors. CS<1>, CS<2> and CS<3> are low, i.e. all of the other bit lines are connected to EQ and receive a constant voltage VEQ.

The embodiments—illustrated in FIGS. 1 and 2 and described above—of the circuit configuration according to the invention for controlling write and read operations of an MRAM memory configuration advantageously have block-by-block generation and feeding of the constant voltage VEQ. As a result, the potential of the non-selected bit lines can be different from block to block. This is advantageous during writing if the high writing current gives rise to a voltage drop on the word line WL. In order to minimize parasitic currents, each block can be individually adapted in this way to the word line voltage prevailing in this region.

According to a further embodiment of the invention, the potential VEQ can also be jointly generated and supplied for the entire memory array. This means that the potential of the non-selected bit lines is of the same magnitude over the entire memory array. This variant saves space, since only one voltage source for generating the potential VEQ has to be provided for the entire memory array.

A further function which is realized in FIGS. 1 and 2 is the supply of the write and read voltages (and also of the constant voltage VEQ) to each bit line from both sides. The reasons for this are as follows:

1) The write current must be able to flow on the bit lines in both directions, in order to be able to write both a logic "1" and a logic "0".

2) Supplying certain voltages from both sides of the bit line has the advantage that the bit line voltage is thereby matched more rapidly to the equipotential voltage VEQ.

Figure 3:
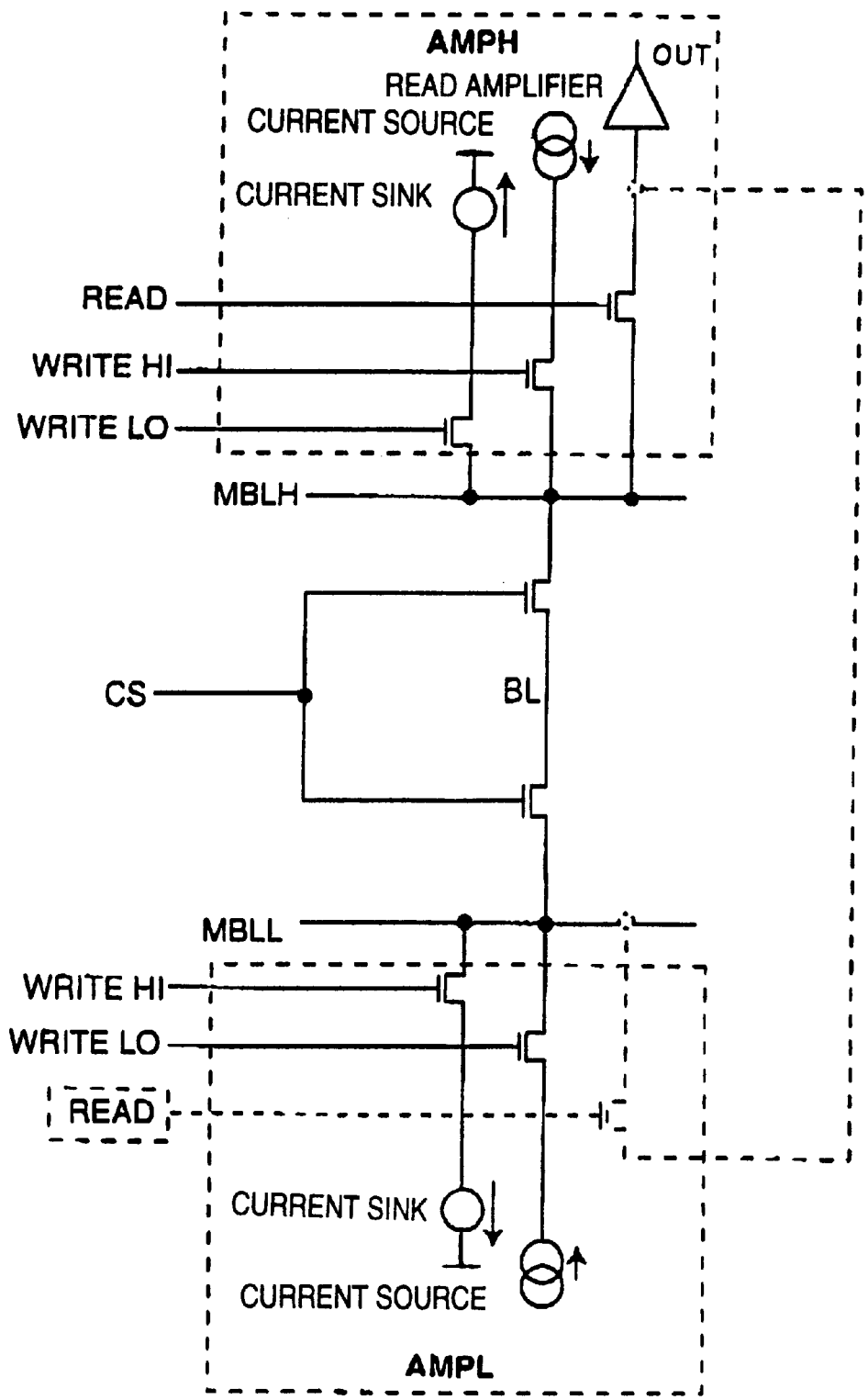
FIG. 3 is a schematic circuit diagram of a basic circuit configuration of an interacting read/write amplifier pair.

In the embodiments of the circuit configuration according to the invention which are shown in FIGS. 1 and 2, each read/write amplifier includes an interacting amplifier pair AMPL and AMPH, the basic circuit of which is illustrated schematically in FIG. 3. Both the amplifier AMPL and the amplifier AMPH have a current source and a current sink, with the result that the write current can flow in both directions, in response to a signal WRITE LOW or WRITE HIGH, in the bit line BL selected through the use of a corresponding column select signal CS. If a bit line EL is selected by the column select signal CS, the signals READ, WRITE HIGH and WRITE LOW decide what access is to be made to the bit line BL. The signal READ enables a read operation, in which the bit line BL is connected to the read amplifier or sense amplifier in AMPH. That end of the bit line EL which is at the bottom in FIG. 3 floats. An alternative is for the bottom end of the bit line also to be connected to the input of the read amplifier during the read operation. This is shown by dashed lines and circuit sections in FIG. 3. With the write signal WRITE HI, the path CURRENT SOURCE-BL-CURRENT SINK from AMPH to AMPL is opened and the write current flows from top to bottom in FIG. 3 and writes for example a logic "1" to the MRAM cell. The write signal WRITE LO opens the path CURRENT SOURCE-BL-CURRENT SINK from AMPL to AMPH, and the write current flows from bottom to top in FIG. 3 and writes for example a logic "0" to the MRAM cell. The above description of the amplifier block illustrated in FIG. 3 makes it clear that AMPH and AMPL with the same ordinal number form a cooperating read/write amplifier pair.

An MRAM memory configuration with the circuit configuration according to the invention in a bit block organization (FIG. 1) or word block organization (FIG. 2) includes, in the embodiments illustrated in the drawing, m bit lines (for a simpler illustration m is equal to 16, by way of example), of which in each case n (for example 4) bit lines are combined. It goes without saying that an MRAM memory configuration according to the invention is not restricted to a maximum of 16 bit lines, nor to the n=4 combined bit lines. However, for an MRAM memory configuration it is advantageous if the quotient m:n produces a power of two, for example 2, 4, 8, 16, 32, etc.

Every circuit which, in the embodiments presented, is presented with an inverted signal which drives an NMOS transistor can alternatively also be implemented with the non-inverted signal which controls a PMOS transistor.

Overall, the circuit configuration according to the invention constitutes a novel selection circuit, which is advantageous for MRAM memory configurations, in the form of a column multiplexer for the word-by-word writing and read-out of an MRAM memory array.

We claim:

1. In an MRAM memory configuration having a plurality of magnetoresistive memory cells with associated bit lines and word lines respectively running in a row direction and a column direction and crossing one another at respective ones of said magnetoresistive memory cells, a circuit configuration for controlling write operations and read operations, comprising:

column select lines for providing column select signals;

selection transistors connected to the bit lines, said selection transistors having respective control electrodes connected to said column select lines and being controllable via the column select signals;

given ones of said selection transistors being first selection transistors, each of the bit lines having ends and having a respective one of said first selection transistors provided at the ends of each of the bit lines on both sides of each of the magnetoresistive memory cells;

read/write amplifiers having respective current sources and current sinks;

output lines connected to said read/write amplifiers;

said first selection transistors being grouped in sections including equal numbers of said first selection transistors, said first selection transistors of each of said sections being jointly connected, at the ends of the bit lines, to a respective interacting pair of said read/write amplifiers via those electrode terminals of said first selection transistors that are not connected to the bit lines; and said read/write amplifiers being controlled such that if a write signal is fed thereto, write currents for writing one of a logic "1" and a logic "0" flow selectively in a first direction and in a second direction opposite thereto in all of the bit lines selected by a corresponding column select signal on a respective one of said column select lines and, if a read signal is fed in, a logic state stored in a selected one of the magnetoresistive memory cells can be read out via a given one of said output lines.

2. The circuit configuration for controlling write operations and read operations according to claim 1, wherein:

given ones of said selection transistors are second selection transistors respectively connected to the two ends of each of the bit lines; and said control electrodes of said second selection transistors are driven by a complement of the corresponding column select signal and a constant voltage is jointly applied to those electrode terminals of said second selection transistors that are not connected to the bit lines such that the bit lines which are not selected by a column select signal are kept at a given potential.

3. The circuit configuration for controlling write operations and read operations according to claim 1, wherein:

the MRAM memory configuration is organized in bit blocks such that said first selection transistors of in each case n successive ones of the bit lines associated with bits of the MRAM memory configuration that are assigned in each case to one of the bit blocks are, at the two ends of the successive ones of the bit lines, in each case jointly connected to an interacting pair of said read/write amplifiers, with n being an integer number;

a respective one of said column select lines selects one of the n successive ones of the bit lines from each of the bit blocks; and given ones of said selection transistors are second selection transistors respectively connected to the two ends of each of the bit lines, and given ones of said second selection transistors associated with the one of the bit blocks are in each case jointly supplied with a constant voltage at the two ends of the bit lines.

4. The circuit configuration for controlling write operations and read operations according to claim 2, wherein the MRAM memory configuration is configured such that the constant voltage is fed to both sides of the bit lines.

5. The circuit configuration for controlling write operations and read operations according to claim 3, wherein the MRAM memory configuration is configured such that the constant voltage is fed to both sides of the bit lines.

6. The circuit configuration for controlling write operations and read operations according to claim 1, wherein:

the MRAM memory configuration is organized in word blocks such that all bits of a word of the MRAM memory configuration are physically provided next to one another, a respective one of said column select lines selects, with a column select signal, one of the word blocks from m of the word blocks, the one of the word blocks is formed of n bits and corresponding n bit lines, and said respective one of said column select lines switches the n bit lines to associated n multiplexed bit lines, with n and m being integer numbers; and said first selection transistors on both sides of in each case one of the n bit lines of all m word blocks and a respective interacting pair of said read/write amplifiers are connected to said n multiplexed bit lines.

7. The circuit configuration for controlling write operations and read operations according to claim 2, wherein:

the MRAM memory configuration is organized in word blocks such that all bits of a word of the MRAM memory configuration are physically provided next to one another, a respective one of said column select lines selects, with a column select signal, one of the word blocks from m of the word blocks, the one of the word blocks is formed of n bits and corresponding n bit lines, and said respective one of said column select lines switches the n bit lines to associated n multiplexed bit lines, with n and m being integer numbers; and said first selection transistors on both sides of in each case one of the n bit lines of all m word blocks and a respective interacting pair of said read/write amplifiers are connected to said n multiplexed bit lines.

8. The circuit configuration for controlling write operations and read operations according to claim 7, wherein the MRAM memory configuration is configured such that the constant voltage is applied to said second selection transistors in each case word block by word block.

9. The circuit configuration for controlling write operations and read operations according to claim 7, wherein the MRAM memory configuration is configured such that the constant voltage is fed to both sides of the bit lines.

10. The circuit configuration for controlling write operations and read operations according to claim 3, wherein the MRAM memory configuration is configured such that a quotient m:4 is a power of 2, with m being an integer number.

11. A magnetoresistive memory configuration, comprising:
- a plurality of magnetoresistive memory cells with associated bit lines and word lines respectively running in a row direction and a column direction and crossing one another at respective ones of said magnetoresistive memory cells;
- a circuit configuration for controlling write operations and read operations including:
  - column select lines for providing column select signals;
  - selection transistors connected to said bit lines, said selection transistors having respective control electrodes connected to said column select lines and being controllable via the column select signals;
  - given ones of said selection transistors being first selection transistors, each of said bit lines having ends and having a respective one of said first selection transistors provided at said ends of each of said bit lines on both sides of each of said magnetoresistive memory cells;
  - read/write amplifiers having respective current sources and current sinks;
  - output lines connected to said read/write amplifiers;
  - said first selection transistors being grouped in sections including equal numbers of said first selection transistors, said first selection transistors of each of said sections being jointly connected, at said ends of said bit lines, to a respective interacting pair of said read/write amplifiers via those electrode terminals of said first selection transistors that are not connected to the bit lines; and
  - said read/write amplifiers being controlled such that if a write signal is fed thereto, write currents for writing one of a logic "1" and a logic "0" flow selectively in a first direction and in a second direction opposite thereto in all of said bit lines selected by a corresponding column select signal on a respective one of said column select lines and, if a read signal is fed in, a logic state stored in a selected one of said magnetoresistive memory cells can be read out via a given one of said output lines.

* * * * *